US006998070B2

(12) United States Patent
Inoue et al.

(10) Patent No.: US 6,998,070 B2
(45) Date of Patent: Feb. 14, 2006

(54) SPUTTERING TARGET AND TRANSPARENT CONDUCTIVE FILM

(75) Inventors: Kazuyoshi Inoue, Sodegaura (JP); Shigeo Matsuzaki, Sodegaura (JP)

(73) Assignee: Idemitsu Kosan Co., Ltd., (JP)

( * ) Notice: Subject to any disclaimer, the term of this patent is extended or adjusted under 35 U.S.C. 154(b) by 14 days.

(21) Appl. No.: 10/483,614

(22) PCT Filed: May 24, 2002

(86) PCT No.: PCT/JP02/05058

§ 371 (c)(1),
(2), (4) Date: Jan. 14, 2004

(87) PCT Pub. No.: WO03/008661

PCT Pub. Date: Jan. 30, 2003

(65) Prior Publication Data

US 2004/0191530 A1    Sep. 30, 2004

(30) Foreign Application Priority Data

Jul. 17, 2001  (JP) .............................. 2001-216618

(51) Int. Cl.
*H01B 1/08*  (2006.01)
(52) U.S. Cl. .................. 252/519.51; 428/922
(58) Field of Classification Search ........... 252/519.51; 428/432, 918, 922; 204/192.21
See application file for complete search history.

(56) References Cited

U.S. PATENT DOCUMENTS

| 5,972,527 | A  * | 10/1999 | Kaijou et al. | ............... 428/697 |
| 6,534,183 | B1 * | 3/2003  | Inoue         | ........................ 428/432 |
| 6,669,830 | B1 * | 12/2003 | Inoue et al.  | ........... 204/298.13 |

FOREIGN PATENT DOCUMENTS

| EP | 0 677 593 A1 | 10/1995 |
| EP | 1 033 355 A1 | 9/2000 |
| JP | 6-234565     | 8/1994  |
| JP | 6-318406     | 11/1994 |
| JP | 7-235219     | 9/1995  |
| JP | 7-335046     | 12/1995 |
| JP | 9-071860     | 3/1997  |

OTHER PUBLICATIONS

English translation of JP 7-235219A.*

* cited by examiner

*Primary Examiner*—Mark Kopec
(74) *Attorney, Agent, or Firm*—Steptoe & Johnson LLP

(57) ABSTRACT

A sputtering target containing a hexagonal laminar compound formed of indium oxide and zinc oxide and represented by $In_2O_3(ZnO)_m$ wherein m is an integer of 2 to 7 and further contains 0.01 to 1 at % of an oxide of a third element having a normal valence of 4 or more, and a transparent electrically conductive film formed therefrom. The sputtering target has a low volume resistivity and permits stable sputtering. The transparent electrically conductive film is excellent in etchability.

6 Claims, No Drawings

SPUTTERING TARGET AND TRANSPARENT CONDUCTIVE FILM

TECHNICAL FIELD

The present invention relates to a sputtering target to be used for forming a transparent electrically conductive film by a sputtering method, and a transparent electrically conductive film formed using the target.

TECHNICAL BACKGROUND

Owing to excellent display performances and low power consumption, thin film liquid crystal displays have come to prevail as display devices for portable personal computers and television. Any liquid crystal display has a sandwich structure in which a liquid crystal display device is interposed between transparent electrically conductive films.

Transparent electrically conductive films for use in these display devices are generally formed by a sputtering method using a sintered body target. As a material for the target, conventionally, an indium-tin oxide (to be abbreviated as "ITO" hereinafter) has been used. That is because a transparent electrically conductive film formed from the ITO target has high light transmittance and further has excellent electrical conductivity. However, the transparent electrically conductive film formed from the ITO target has a problem that since the etching thereof requires a strong acid such as aqua regia, hydrochloric acid or hydrobromic acid, a wiring material in a thin film liquid crystal display may be ultimately also etched.

For overcoming the above problem, therefore, JP-A-6-234565 and JP-A-6-318406 propose a method in which a film is formed from a sputtering target formed of a zinc-oxide-indium-oxide-containing material. When a transparent electrically conductive film formed from the above sputtering target formed of a zinc-oxide-indium-oxide-containing material is used, a weak acid such as oxalic acid can be used, so that the wiring material in a thin film liquid crystal display is no longer likely to be ultimately etched. Since, however, the above sputtering target formed of a zinc-oxide-indium-oxide-containing material has a high volume resistivity itself, there is caused a problem that the target breaks or causes abnormal discharge during sputtering.

Further, for decreasing the volume resistivity of the above sputtering target formed of a zinc-oxide-indium-oxide-containing material, JP-A-9-71860 proposes a sputtering target formed by adding an oxide of a metal having a normal valence of 3 or more to a zinc-oxide-indium-oxide-containing material. However, there is a problem that a transparent electrically conductive film formed from the above target has no sufficient etching property, although the volume resistivity of the target can be decreased by adding an oxide of a metal having a normal valence of 3 or more.

It is an object of the present invention to provide a sputtering target that has a low volume resistivity and permits stable sputtering, and a transparent electrically conductive film that is formed from the target and is excellent in etchability.

The present inventors have made diligent studies, and as a result, it has been found that the above object can be achieved by a sputtering target containing a hexagonal laminar compound formed of indium oxide and zinc oxide and further containing an oxide of a third element having a normal valence of 4 or more. On the basis of the above finding, the present invention has been completed.

DISCLOSURE OF THE INVENTION

That is, the subject matters of the present invention are as follows.

(1) A sputtering target containing a hexagonal laminar compound formed of indium oxide and zinc oxide and represented by $In_2O_3(ZnO)_m$ wherein m is an integer of 2 to 7 and further containing 0.01 to 1 at % of an oxide of a third element having a normal valence of 4 or more.

(2) A sputtering target as recited in the above (1), wherein the atomic ratio of indium atom to the total of indium atom and zinc atom $[In/(In+Zn)]$ is from 0.7 to 0.95.

(3) A sputtering target as recited in the above (1) or (2), wherein the third element having a normal valence of 4 or more is one or more elements selected from the group consisting of titanium, zirconium, hafnium, cerium, vanadium, niobium, tantalum, ruthenium, rhodium, iridium, germanium, tin, antimony and lead.

(4) A sputtering target as recited in any one of the above (1) to (3), which has a relative density of 0.95 or more.

(5) A transparent electrically conductive film formed from the sputtering target as recited in any one of the above (1) to (4) by a sputtering method.

BEST MODE FOR CARRYING OUT THE INVENTION

The sputtering target of the present invention is a sputtering target containing a hexagonal laminar compound formed of indium oxide and zinc oxide and represented by $In_2O_3(ZnO)_m$ wherein m is an integer of 2 to 7 and further containing 0.01 to 1 at % of an oxide of a third element having a normal valence of 4 or more.

The hexagonal laminar compound formed of indium oxide and zinc oxide, contained in the above sputtering target, is a compound that exhibits an X-ray diffraction pattern assigned to a hexagonal laminar compound in a measurement based on an X-ray diffraction method, and the hexagonal laminar compound contained in the sputtering target of the present invention is a compound represented by $In_2O_3(ZnO)_m$. In the above formula, m is an integer of 2 to 7, preferably 3 to 5. That is because a compound of the formula in which m is 1 has no hexagonal laminar structure, and because a compound of the formula in which m exceeds 7 has a high volume resistivity although it has a hexagonal laminar structure. The above hexagonal laminar compound is formed by sintering a mixture of indium oxide and zinc oxide. In this case, indium oxide and zinc oxide form a hexagonal laminar compound in an amount ratio corresponding to their stoichiometric ratio. Indium oxide or zinc oxide present in an amount over the stoichiometric ratio is present as a crystalline material in the sintered body.

Concerning the content ratio of indium oxide and zinc oxide contained in the sputtering target, the atomic ratio of the indium atom to the total of the indium atom and the zinc atom, $[In/(In+Zn)]$ is preferably 0.7 to 0.95. When the atomic ratio of the indium atom is less than 0.7, the specific resistance of a transparent electrically conductive film formed from such a sputtering target can increase. When the atomic ratio of the indium atom exceeds 0.95, a transparent electrically conductive film formed from the target can be crystallized to decrease light transmittance, or its specific resistance can be caused to increase. The above atomic ratio of the indium atom is more preferably 0.8–0.95, since such a sputtering target also has excellent durability.

Further, the third element having a normal valence or 4 or more, contained in the sputtering target of the present invention, preferably is one or more elements selected from the group consisting of titanium, zirconium, hafnium, cerium, vanadium, niobium, tantalum, ruthenium, rhodium, iridium, germanium, tin, antimony and lead. Of these, cerium, tin, antimony, lead, zirconium, hafnium, germanium and ruthenium are particularly preferred.

The content of an oxide of the third element having a normal valence of 4 or more in the sputtering target is 0.01 to 1 at %. By bringing the content of an oxide of the third element into the above range, the volume resistivity of the sputtering target can be fully decreased. That is, the volume resistivity can be decreased to 7 mΩcm or less, preferably 5 mΩcm or less at which abnormal discharge does not occur or the target does not break during the formation of a film from the target. The above target gives a transparent electrically conductive film that can be easily etched with a weak acid such as oxalic acid. When the content of the above oxide of the third element is less than 0.01 at %, the volume resistivity of the sputtering target cannot be controlled so as to be a fully low value. When the content of the above oxide of the third element exceeds 1 at %, it may be difficult to etch a transparent electrically conductive film formed from the target, with a weak acid such as oxalic acid. The content of the oxide of the third element is more preferably 0.02 to 0.2 at %, still more preferably 0.03 to 0.1 at %.

The above sputtering target has a relative density of 95% or more, preferably 96% or more. Such a target has high mechanical strength and excellent electrical conductivity, so that the target can have improved stability during sputtering with the target fixed to an RF magnetron sputtering apparatus or a DC magnetron sputtering apparatus. The above relative density refers to a percentage of an actually measured density of a sputtering target based on a theoretical density calculated from densities inherent to indium oxide and zinc oxide and their compositional ratio.

Concerning the method of producing the above sputtering target, the sputtering target can be produced by the steps of mixing indium oxide, zinc oxide and an oxide of the third element having a normal valence of 4 or more as raw materials, shaping a mixture of the raw materials into a shaped body, sintering the shaped body and annealing a sintered body.

The indium oxide, zinc oxide and the oxide of the third element are desirably selected from raw materials having high purity, and the raw materials have a purity of at least 99%. The purity thereof is preferably at least 99.9%, more preferably at least 99.99%. The reason therefor is that when raw materials having high purity are used, a sintered body having a dense system is obtained, and a sputtering target formed of the sintered body comes to have a low volume resistivity. Further, the above metal oxides as raw materials suitably have an average particle diameter of 0.01 to 10 $\mu$m, preferably 0.05 to 5 $\mu$m, more preferably 0.1 to 5 $\mu$m. When the average particle diameter of these metal oxides is less than 0.01 $\mu$m, the metal oxides are liable to aggregate. When it exceeds 10 $\mu$m, they have an insufficient mixing property, and a sintered body having a dense system may not be obtained. These metal oxides as raw materials can be mixed with a general mixing device such as a ball mill, a jet mill or a roll mill.

While the thus-obtained mixture may be directly shaped into a shaped body, it is preferred to carry out preliminary firing treatment thereof before the shaping. Concerning preliminary firing treatment conditions, the preliminary firing temperature is 800 to 1,500° C., preferably 900 to 1,400° C., more preferably 1,000 to 1,300° C., and the firing time period is 1 to 100 hours, preferably 2 to 50 hours, more preferably 3 to 30 hours. When the metal oxide powder as raw materials is subjected to the preliminary firing under the above conditions, the formation of a hexagonal laminar compound formed of indium oxide and zinc oxide is promoted. The above preliminary firing treatment may be carried out once, or may be repeated twice or more times. Further, when granulated, the metal oxide powder subjected to the above preliminary firing treatment comes to be improved in flowability and filling property in the shaping step later. The above granulation treatment can be carried out with a spray dryer, or the like. Preferably, the above granulation treatment is carried out by a method using an aqueous solution or alcohol solution of the above metal oxide powder and a binder such as polyvinyl alcohol. The granulation product formed by the above granulation treatment has a particle diameter of 1 to 100 $\mu$m, preferably 5 to 100 $\mu$m, more preferably 10 to 100 $\mu$m.

Then, in the shaping step, the powder or granulation product of the metal oxides is shaped by a method such as press-molding, cast molding, injection molding, or the like. For obtaining a sintered body having a high sintering density as a sputtering target, the above shaping step is preferably carried out by a method in which a preliminary shaping is performed by press-molding and then a preliminary-shaped product is further compacted under pressure by a method of cold hydrostatic-pressure press-molding or the like. In the above shaping step, various shaping aids can be used, and it is preferred to use polyvinyl alcohol, methyl cellulose, polywax or oleic acid. The shaping pressure is 1 MPa to 10 GPa, preferably 10 MPa to 10 GPa. Further, the shaping time period can be determined to be 10 minutes to 10 hours. The above shaped body preferably has a form having dimensions corresponding to the dimensions of a transparent electrically conductive film to be formed by sputtering for easily finishing the sputtering target by adjusting the form after sintering.

In the step of sintering the thus-obtained shaped body, the shaped body can be sintered by a generally employed sintering method such as atmospheric-pressure sintering, hot press sintering or hot hydrostatic-press sintering. Concerning the condition for the above sintering, the sintering temperature is 1,200 to 1,600° C., preferably 1,250 to 1,550° C., more preferably 1,300 to 1,500° C. When the above sintering temperature is lower than 1,200° C., a hexagonal laminar compound of indium oxide and zinc oxide may not be fully formed in a sintered boy obtained. Further, when the sintering temperature exceeds 1,600° C., the composition of the metal oxides in a sintered body obtained may vary due to the sublimation of indium oxide and zinc oxide, and the value of m in the formula $In_2O_3(ZnO)_m$ in the hexagonal laminar compound formed may exceed 7, so that a sintered body has a high volume resistivity. Although differing depending upon the sintering temperature, the sintering time period is 1 to 50 hours, preferably 2 to 30 hours, more preferably 3 to 20 hours. The atmosphere during the above sintering may be air, a reducing gas such as hydrogen gas, methane gas or carbon monoxide, or an inert gas such as argon gas or nitrogen gas.

Then, in the annealing step, the thus-obtained sintered body is annealed in a sintering furnace or a hot press reducing furnace at an annealing temperature of 200 to 1,000° C., preferably 300 to 1,000° C., more preferably 400 to 1,000° C., for an annealing time period of 1 to 50 hours, preferably 2 to 30 hours, more preferably 3 to 20 hours.

When the annealing treatment is carried out under the above conditions, the volume resistivity of the sintered body can be decreased. The annealing treatment may be carried out in vacuum, or it may be carried out in the atmosphere of a reducing gas such as hydrogen gas, methane gas or carbon oxide gas or in the atmosphere of an inert gas such as argon gas or nitrogen gas.

For forming a sputtering target from the thus-obtained sintered body, the sintered body can be grounded so as to have a form suitable for mounting it to a sputtering apparatus and an attaching tool is fixed thereto.

When the above sputtering target is used to form a transparent electrically conductive film, the transparent electrically conductive film is formed on a substrate. The substrate is preferably selected from transparent substrates, and a conventionally used glass substrate, or a film or sheet made of a highly transparent synthetic resin can be used. The above synthetic resin includes polycarbonate resins, polymethyl methacrylate resins, polyester resins, polyether sulfone resins and polyallylate resins.

When the above sputtering target is used to form a transparent electrically conductive film on the transparent substrate by a sputtering method, a magnetron sputtering apparatus is preferred. Concerning the condition of film formation by sputtering using the above apparatus, the output of plasma varies depending upon the surface area of the target or the thickness of the transparent electrically conductive film. Generally, however, the plasma output is set in a range of 0.3 to 4 W per cm$^2$ of the target surface area, and the film formation time period is determined to be 5 to 120 minutes, whereby a transparent electrically conductive film having an intended thickness can be obtained. While the thickness of the above transparent electrically conductive film changes depending upon displays in kind, the thickness is generally 200 to 6,000 angstroms, preferably 300 to 2,000 angstroms.

The thus-obtained transparent electrically conductive film has such transparency that its light transmittance to light having a wavelength of 500 nm is at least 80%. The above transparent electrically conductive film is therefore suitable for use as a transparent electrode in various display devices such as a liquid crystal display device and an organic electroluminescence display device that is required to have high transparency and electrical conductivity.

EXAMPLES

The present invention will be explained in detail with reference to Examples and Comparative Examples hereinafter.

Example 1

(1) Preparation of Sputtering Target

280 Grams of an indium oxide powder (average particle diameter 1 μm) having a purity of 99.99% and 19.7 g of a zinc oxide powder (average particle diameter 1 μm) having a purity of 99.9% and 0.3 g of a tin oxide powder (average particle diameter 1 μm) having a purity of 99.99% as an oxide of a third element having a normal valence of 4 or more were placed as raw materials in a pot made of polyimide together with ethyl alcohol and zirconia balls, and these materials were mixed by means of a planetary ball mill for 2 hours.

Then, the obtained powder mixture was placed in a mold of a press-molding machine and preliminarily shaped under a pressure of 10 MPa. A shaped body obtained by the preliminary shaping was compacted with a cold hydrostatic-pressure press-molding machine under a pressure of 400 MPa, then charged into a sintering furnace and fired in an air atmosphere at 1,450° C. for 8 hours.

The thus-obtained sintered body was evaluated for its crystal structure with an X-ray diffraction measuring apparatus supplied by Rigakusha, to show that a hexagonal laminar compound formed of indium oxide and zinc oxide and represented by $In_2O_3(ZnO)_3$ and indium oxide represented by $In_2O_3$ were present. Further, the sintered body was composition-analyzed with inductive coupling plasma emission spectroscopy (ICP analysis) using SPS-1500VR supplied by Seiko Instruments Inc. As a result, it was found that the atomic ratio of indium oxide to the total of indium oxide and zinc oxide, [In/(In+Zn)] in the sintered body was 0.89, and that the atomic % of tin oxide to the total of indium oxide, zinc oxide and tin oxide, [Sn/(In+Zn+Sn)]×100, was 0.088%.

The above sintered body had a relative density of 96.5%. Further, a 20 mm×40 mm×5 mm test piece was prepared from the above sintered body, and the test piece was measured for a volume resistivity by a four-probe method to show 0.1 mΩ·cm.

(2) Lifetime Test of Sputtering Target

The sintered body obtained in the above (1) was ground to prepare a sputtering target having a diameter of about 10 cm and a thickness of about 5 mm. The sputtering target was mounted to a DC magnetron sputtering apparatus, and a transparent electrically conductive film was formed on a glass substrate at room temperature. Concerning sputtering conditions, a mixture prepared by mixing argon gas with a proper amount of oxygen gas was used as an atmosphere, and a lifetime test for 100 hours was carried out under a sputtering pressure of $3 \times 10^{-1}$ Pa at an ultimate pressure of $5 \times 10^{-4}$ Pa, at a substrate temperature of 25° C. and at an input voltage of 5 W/cm$^2$. As a result, no abnormal discharge was observed, and the sputtering target caused no breaking.

(3) Evaluation of Transparent Electrically Conductive Film for Etchability

Part of the transparent electrically conductive film formed on the glass substrate in the above (2) was etched with an oxalic acid aqueous solution having an oxalic acid concentration of 3.4 mass % at 30° C. As a result, the transparent electrically conductive film showed an etching rate of 860 Å/min. and it was found that the transparent electrically conductive film had excellent etchability.

Table 1 shows the composition, properties and evaluation results of the sputtering target prepared in this Example.

Example 2

(1) Preparation of Sputtering Target

A sputtering target was obtained in the same manner as in Example 1 except that the amount of zinc oxide was changed to 19.9 g and the amount of tin oxide was changed to 0.1 g as raw materials.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Example 3

(1) Preparation of Sputtering Target

A sputtering target was obtained in the same manner as in Example 1 except that the tin oxide powder was replaced with 0.2 g a cerium oxide powder (an average particle diameter of 3 μm) having a purity of 99.99% as an oxide of a third element having a normal valence of 4 or more as a raw material.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Example 4

(1) Preparation of Sputtering Target

A sputtering target was obtained in the same manner as in Example 1 except that the tin oxide powder was replaced with 0.2 g a zirconium oxide powder (an average particle diameter of 4 μm) having a purity of 99.99% as an oxide of a third element having a normal valence of 4 or more as a raw material.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Example 5

(1) Preparation of Sputtering Target

A sputtering target was obtained in the same manner as in Example 1 except that the tin oxide powder was replaced with 0.2 g a germanium oxide powder (an average particle diameter of 3 μm) having a purity of 99.999% as an oxide of a third element having a normal valence of 4 or more as a raw material.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Example 6

(1) Preparation of Sputtering Target

A sputtering target was obtained in the same manner as in Example 1 except that the tin oxide powder was replaced with 0.2 g a ruthenium oxide powder (an average particle diameter of 4 μm) having a purity of 99.9% as an oxide of a third element having a normal valence of 4 or more as a raw material.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Comparative Example 1

(1) Preparation of Sputtering Target

A sputtering target was obtained in the same manner as in Example 1 except that the amount of indium oxide as a raw material was changed to 260 g, that the amount of zinc oxide as a raw material was changed to 20 g and that the amount of tin oxide was changed to 20 g.

(2) Lifetime Test of Sputtering Target

A lifetime test was carried out in the same manner as in (2) of Example 1 except that the sputtering target was replaced with the sputtering target obtained in the above (1).

(3) Evaluation of Transparent Electrically Conductive Film for Etchability

The transparent electrically conductive film formed in the above (2) was evaluated for etchability in the same manner as in (3) of Example 1.

Table 1 shows the results.

Comparative Example 2

(1) Preparation of Sputtering Target

A sputtering target was obtained in the same manner as in Example 1 except that the amount of indium oxide as a raw material was changed to 294 g, that the amount of zinc oxide as a raw material was changed to 3.4 g and that the oxide of the third element having a normal valence of 4 or more was not added.

In the evaluation of the above sputtering target for a crystal structure by the X-ray diffraction method, the presence of indium oxide was found, while the presence of a hexagonal laminar compound was not found.

(2) Lifetime Test of Sputtering Target

A lifetime test was carried out in the same manner as in (2) of Example 1 except that the sputtering target was replaced with the sputtering target obtained in the above (1).

As a result, abnormal discharge was observed 25 hours after the formation of a transparent electrically conductive film was started. Then, the sputtering target underwent breaking 30 hours after, so that the film formation was discontinued.

Table 1 shows the results.

Comparative Example 3

(1) Preparation of Sputtering Target

A sputtering target was obtained in the same manner as in Example 1 except that the amount of indium oxide as a raw material was changed to 240 g, that the amount of zinc oxide as a raw material was changed to 60 g and that the oxide of the third element having a normal valence of 4 or more was not added.

In the evaluation of the above sputtering target for a crystal structure by the X-ray diffraction method, it was found that a compound represented by $In_2O_3(ZnO)_5$ was formed as a hexagonal laminar compound.

(2) Lifetime Test of Sputtering Target

A lifetime test was carried out in the same manner as in (2) of Example 1 except that the sputtering target was replaced with the sputtering target obtained in the above (1).

As a result, abnormal discharge was found 50 hours after the formation of a transparent electrically conductive film was started, and at the same time, the sputtering target underwent breaking, so that the film formation was discontinued.

Table 1 shows the results.

TABLE 1

| | Example (CEx.) | | | | | | | | |
|---|---|---|---|---|---|---|---|---|---|
| | 1 | 2 | 3 | 4 | 5 | 6 | (1) | (2) | (3) |
| Sputtering target | | | | | | | | | |
| In/(In + Zn) | 0.89 | 0.89 | 0.89 | 0.89 | 0.89 | 0.89 | 0.81 | 0.97 | 0.70 |
| Third element [oxide] | $SnO_2$ | $SnO_2$ | $CeO_2$ | $ZrO_2$ | $GeO_2$ | $RuO_2$ | $SnO_2$ | — | — |
| Content of third element (at %) | 0.088 | 0.029 | 0.051 | 0.072 | 0.085 | 0.066 | 6.6 | — | — |
| Relative density(%) | 96.5 | 96.4 | 96.1 | 96.3 | 96.6 | 96.4 | 93.2 | 93.8 | 92.8 |
| Volume resistivity (mΩcm) | 0.1 | 0.2 | 0.1 | 0.3 | 0.2 | 0.1 | 0.9 | 680 | 34.5 |
| Abnormal discharge during film formation | No | No | No | No | No | No | No | Yes*2 | Yes*4 |
| Breaking during film formation | No | No | No | No | No | No | No | Yes*3 | Yes*5 |
| Etchability of transparent electrically conductive film*1 | 860 | 870 | 850 | 850 | 840 | 820 | 280 | — | — |

(CEx) = (Comparative Example)
*1 Unit: Å/min.
*2 25 hours after start of film formation
*3 30 hours after start of film formation
*4 50 hours after start of film formation
*5 50 hours after start of film formation

INDUSTRIAL UTILITY

The sputtering target of the present invention has a low volume resistivity, so that there is no abnormal discharge or breaking during film formation. Further, a transparent electrically conductive film formed therefrom has excellent etchability.

The invention claimed is:

1. A sputtering target containing a hexagonal laminar compound formed of indium oxide and zinc oxide and represented by $In_2O_3(ZnO)_m$ wherein m is an integer of 2 to 7, and 0.02 to 0.2 at % of an oxide of a third element having a normal valence of 4 or more.

2. A sputtering target as recited in claim 1, wherein the atomic ratio of indium atom to the total of indium atom and zinc atom [In/(In+Zn)] is from 0.7 to 0.95.

3. A sputtering target as recited in claim 1, wherein the third element having a normal valence of 4 or more is one or more elements selected from the group consisting of titanium, zirconium, hafnium, vanadium, niobium, tantalum, ruthenium, rhodium, iridium, germanium, tin, antimony and lead.

4. A sputtering target as recited in claim 1, wherein the third element having a normal valence of 4 or more is cerium.

5. A sputtering target as recited in claim 1, which has a relative density of 0.95 or more.

6. A transparent electrically conductive film formed from the sputtering target as recited in claim 1 by a sputtering method.

* * * * *